(12) United States Patent
Holma et al.

(10) Patent No.: US 9,226,384 B2
(45) Date of Patent: Dec. 29, 2015

(54) CIRCUIT BOARD SYSTEM COMPRISING A COOLING ARRANGEMENT

(71) Applicant: TELLABS OY, Espoo (FI)

(72) Inventors: Antti Holma, Espoo (FI); Petri Kohonen, Vantaa (FI)

(73) Assignee: CORIANT OY, Espoo (FI)

( * ) Notice: Subject to any disclaimer, the term of this patent is extended or adjusted under 35 U.S.C. 154(b) by 132 days.

(21) Appl. No.: 14/172,039

(22) Filed: Feb. 4, 2014

(65) Prior Publication Data

US 2014/0218868 A1 Aug. 7, 2014

(30) Foreign Application Priority Data

May 2, 2013 (FI) ...................................... 20135113

(51) Int. Cl.
*H05K 7/20* (2006.01)
*H05K 1/02* (2006.01)

(52) U.S. Cl.
CPC ............ *H05K 1/0209* (2013.01); *H05K 1/0204* (2013.01); *H05K 1/0206* (2013.01); *H05K 1/0207* (2013.01); *H05K 1/0284* (2013.01); *H05K 2201/09045* (2013.01)

(58) Field of Classification Search
CPC . H05K 1/0209; H05K 1/0206; H05K 1/0207; H05K 1/0284
USPC ........... 361/704, 705, 707, 712, 713; 257/720
See application file for complete search history.

(56) References Cited

U.S. PATENT DOCUMENTS

| | | | | |
|---|---|---|---|---|
| 6,774,306 B2* | 8/2004 | Smith | ................... | H01L 21/563 174/541 |
| 7,960,827 B1* | 6/2011 | Miller, Jr. | ........... | H01L 23/3677 257/712 |
| 8,913,390 B2* | 12/2014 | Malek | .................... | H05K 7/205 165/104.33 |
| 2003/0183418 A1* | 10/2003 | Castro | ................. | H01L 21/4857 174/260 |
| 2005/0168941 A1* | 8/2005 | Sokol | ................. | H05K 7/20445 361/688 |
| 2006/0292722 A1* | 12/2006 | Becker | ................. | H05K 1/0204 438/28 |
| 2007/0126115 A1 | 6/2007 | Yanagihara et al. | | |

FOREIGN PATENT DOCUMENTS

| | | |
|---|---|---|
| EP | 1261028 A2 | 11/2002 |
| JP | H06314861 | 11/1994 |
| JP | H07321471 | 12/1995 |
| JP | H0832183 | 2/1996 |

(Continued)

OTHER PUBLICATIONS

Finnish Search Report dated Nov. 29, 2013, corresponding to the Foreign Priority Application No. 20135113.

(Continued)

*Primary Examiner* — Anthony Haughton
(74) *Attorney, Agent, or Firm* — Young & Thompson

(57) ABSTRACT

A circuit board system includes a circuit board (101), at least one electrical component (102), and a conductor part (103) in heat conducting relation with the electrical component. A surface of the circuit board includes a portion (104) that is uneven so as to increase the surface area of the portion. The portion is coated with a coating (105) made of conductor material so that a surface of the coating is uneven. The circuit board includes a heat conductive pathway (106) made of conductor material and extending from the conductor part to the coating. Thus, the coating operates as a cooling element for cooling the electrical component.

16 Claims, 3 Drawing Sheets

(56) References Cited

FOREIGN PATENT DOCUMENTS

| | | |
|---|---|---|
| JP | H09307238 | 11/1997 |
| JP | 2010080572 | 4/2010 |

OTHER PUBLICATIONS

European Search Report, dated May 15, 2014, from corresponding EP application.

* cited by examiner

CIRCUIT BOARD SYSTEM COMPRISING A COOLING ARRANGEMENT

FIELD OF THE INVENTION

The invention relates to a circuit board system comprising a circuit board, at least one electrical component, and a cooling arrangement for cooling the electrical component.

BACKGROUND

A typical circuit board system comprises a circuit board furnished with electrical components. The circuit board comprises a body made of one or more layers of electrically insulating material and electrical conductors on one or both of the surfaces of the circuit board and/or between the layers of the electrically insulating material. Each of the electrical components can be, for example, an integrated circuit such as a processor or a memory, or a discrete component such as a resistor, a capacitor, an inductor, a transistor, or a diode. Furthermore, the circuit board system may comprise also other elements than electrical components. Examples of the other elements are mechanical support elements and elements related to cooling arrangements.

A cooling arrangement is needed when heat generation of an electrical component is so high with respect to the mechanical dimensions of the electrical component that the ability of the outer surface of the electrical component to transfer heat to ambient air is not sufficient. For the sake of illustration, we consider a case where the circuit board system comprises an electrical component on one side of a circuit board. The cooling arrangement may comprise for example a cooling element installed on top of the electrical component. In some cases, it is however mechanically not possible to place the cooling element on top of the electrical component. In another example, the cooling arrangement comprises a heat conductive pathway for conducting heat generated by the electrical component through the circuit board to the other side of the circuit board and the cooling arrangement further comprises a cooling element on the other side of the circuit board so that the cooling element is in heat conducting relation with the heat conductive pathway. In some cases, it is however mechanically not possible to place the cooling element so that the cooling element is located on the opposite side of the circuit board with respect to the electrical component to be cooled.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new circuit board system that can be, for example but not necessarily, a part of telecommunication equipment. A circuit board system according to the invention comprises:

a circuit board having a first surface and a second surface opposite to the first surface,
at least one electrical component, and
a conductor part in heat conducting relation with the electrical component, wherein:
the first surface of the circuit board comprises a portion that is uneven so as to increase surface area of the portion, the portion comprising grooves and/or cavities for increasing the surface area of the portion,
the portion of the first surface is coated with a coating made of conductor material so that a surface of the coating is uneven, and
the circuit board comprises a heat conductive pathway made of conductor material and extending from the conductor part to the coating.

The above-mentioned coating operates as a cooling element for cooling the electrical component and thus, in conjunction with circuit board systems according to some exemplifying embodiments of the invention, there is no need for a separate cooling element. This reduces the number of components of the circuit board system, and thereby the susceptibility to damages and the costs of the circuit board system are reduced. It is, however, also possible that circuit board systems according to some other exemplifying embodiments of the invention further comprise a cooling element on top of the electrical component so as to make the cooling more effective.

The above-mentioned conductor part, the coating, and the heat conductive pathway are advantageously made of one or more metal and/or one or more other materials each having thermal conductivity better than that of the electrically insulating material of the circuit board.

A number of non-limiting exemplifying embodiments of the invention are described in accompanied dependent claims.

Various non-limiting exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated.

BRIEF DESCRIPTION OF THE FIGURES

Exemplifying embodiments of the invention and their advantages are explained in greater detail below in the sense of examples and with reference to the accompanying drawings, in which.

DESCRIPTION OF THE EXEMPLIFYING EMBODIMENTS

Figure 1A:
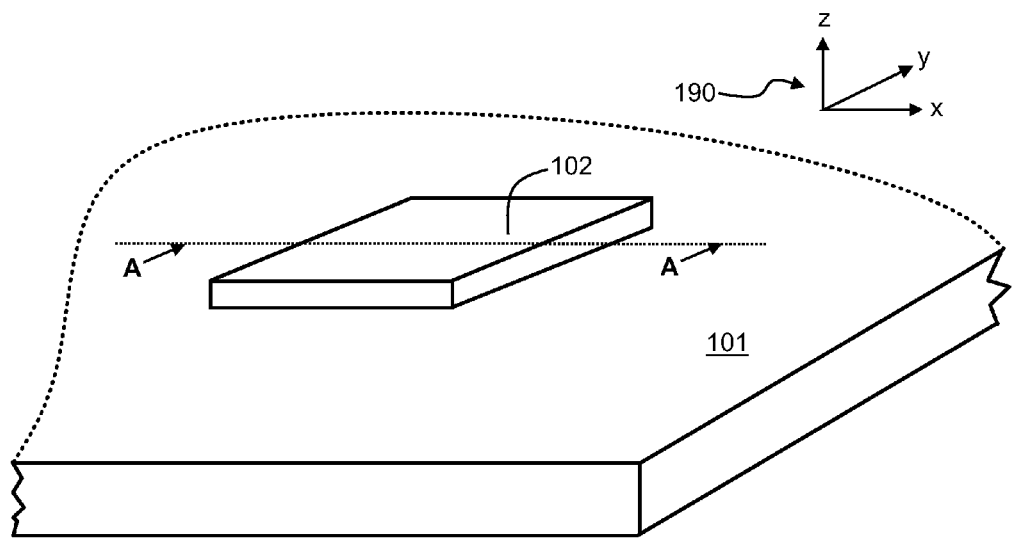
FIGS. 1a and 1b illustrate a detail of a circuit board system according to an exemplifying embodiment of the invention.
Figure 1B:
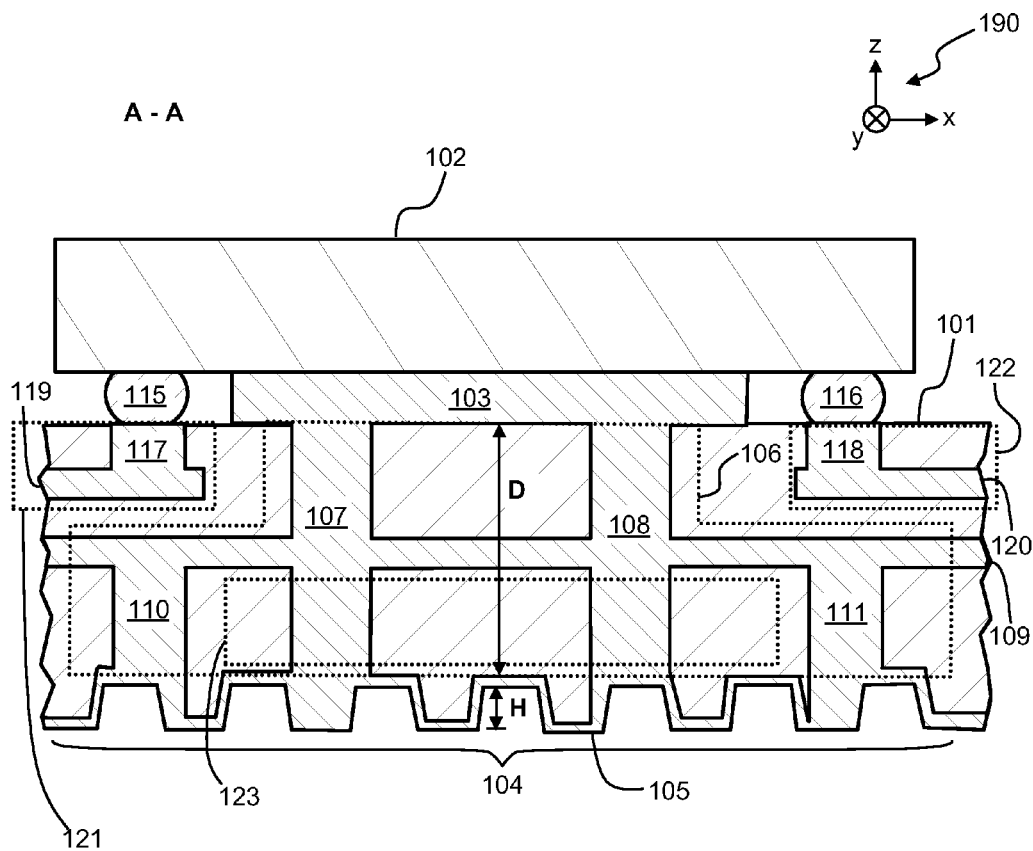

FIG. 1a shows a perspective view of a part of a circuit board system according to an exemplifying embodiment of the invention. FIG. 1b shows a view of a section taken along the line A-A shown in FIG. 1a. The circuit board system comprises a circuit board 101 furnished with electrical components one of which is denoted with a reference number 102. The circuit board 101 is parallel with the xyplane of a coordinate system 190. The circuit board system can be, for example but not necessarily, a part of telecommunication equipment and it may comprise, for example, a processing system for supporting at least one of the following data transfer protocols: Internet Protocol "IP", Ethernet protocol, MultiProtocol Label Switching "MPLS" protocol, Asynchronous Transfer Mode "ATM".

A first surface of the circuit board 101 comprises a portion 104 that is uneven so as to increase the surface area of the portion. The portion 104 may comprise, for example, grooves made by cutting and/or cavities made by drilling so as to increase the surface area. The portion is coated with a coating 105 made of conducfor material so that the surface of the coating is uneven as illustrated in FIG. 1b. The circuit board system comprises a conductor part 103 on a second surface of the circuit board 101 in heat conducting relation with the electrical component 102. In this exemplifying case, the conductor part 103 is between the electrical component 102 and the second surface of the circuit board 101. It is also possible that the conductor part 103 is embedded in the circuit board so that a surface of the conductor part 103 constitutes a part of the second surface of the circuit board. In some cases it is possible that the conductor part is beside the electrical component so that the electrical component is pressed against the conductor part in a direction parallel with the circuit board. The circuit board comprises a heat conductive pathway 106 made of conductor material and extending from the conductor part 103 to the coating 105. Thus, the coating 105 operates as a cooling element for cooling the electrical component 102.

In the exemplifying circuit board system illustrated in FIGS. 1a and 1b, the heat conductive pathway 106 comprises first via-conductors connected to the conductor part 103 and to a first conductor 109 that is parallel with the circuit board and located inside the circuit board. In FIG. 1b, two of the first via-conductors are denoted with reference numbers 107 and 108. It is to be noted that in some other exemplifying cases there can be only one first via-conductor. The heat conductive pathway 106 comprises second via-conductors connected to the first conductor 109 and extending from the first conductor towards the first surface of the circuit board. In FIG. 1b, two of the second via-conductors are denoted with reference numbers 110 and 111. It is to be noted that in some other exemplifying cases there can be only one second via-conductor. Each of the second via-conductors 110 and 111 is farther from the second surface of the circuit board than any of the first via-conductors 107 and 108 is. In other words, the shortest distance from any of the second via-conductors to the second surface of the circuit board is greater than the shortest distance from any of the first via-conductors to the second surface of the circuit board. Furthermore, each of the second via-conductors is a distance apart from each of the first via-conductors in a direction parallel with the circuit board. The conductor part 103, the coating 105, the first conductor 109, and the first and second via-conductors 107, 108, 110 and 111 are advantageously made of metal or other material whose thermal conductivity is better than that of the electrically insulating material of the circuit board 101. The metal may comprise, for example but not necessarily, copper, tin, aluminum, and/or silver. The first conductor 109 can be, for example, a planar conductor formed by a conductor layer of the circuit board.

The heat conductive pathway 106 constituted by the first and second via-conductors 107, 108, 110 and 111, and the first conductor 109 is arranged to circumvent the room needed for electrical conductors connected to the electrical component 102. In the exemplifying case illustrated in FIGS. 1a and 1b, the electrical conductors are partially located in spatial areas 121 and 122 between electrical terminals 115 and 116 of the electrical component 102 and a part of the heat conductive pathway 106. In this exemplifying case, the above-mentioned electrical conductors comprise via-conductors 117 and 118 connected to the electrical terminals of the electrical component 102 and conductors 119 and 120 that are parallel with the circuit board and located inside the circuit board. In the exemplifying case illustrated in FIGS. 1a and 1b, the electrical terminals 115 and 116 of the electrical component 102 are connection balls.

The non-through, i.e. blind, via-conductors 110, 111, 117, and 118 shown in FIG. 1b, can be manufactured for example so that non-through, i.e. blind, via-holes of the circuit board 101 are filled with conductive material. It is also possible to use tubular via-conductors which are manufactured so that walls of the via-holes of the circuit board are coated with the conductive material. When there are tubular via-conductors instead of the full via-conductors shown in FIG. 1b, the tubular non-through via-conductors can be manufactured so that a through via-hole of the circuit board is first coated with the conductive material so as to from a tubular through via-conductor, and then the tubular through via-conductor is cut using a laser beam directed via the hole of the tubular through via-conductor to the wall of the tubular through via-conductor. For example, tubular non-through via-conductors manufactured in the way described above can be used instead of the full non-through via-conductors 110 and 117, and/or instead of the full non-through via-conductors 111 and 118.

In the exemplifying circuit board system illustrated in FIGS. 1a and 1b, the first via-conductors 107 and 108 extend through the first conductor 109 to the coating 105 and the second via-conductors 110 and 111 extend to the coating 105. It is also possible that the first via-conductors 107 and 108 end at the first conductor 109 if a spatial area 123 between the first conductor 109 and the coating 105 is needed for other use.

In a circuit board system according to an exemplifying embodiment of the invention, the surface of the coating 105 is uneven so that the maximum height difference H in a direction perpendicular to the circuit board is at least 15% of the minimum distance D between the coating and the second surface of the circuit board.

The maximum height difference H and the minimum distance D are illustrated in FIG. 1b In a circuit board system according to an exemplifying embodiment of the invention, the maximum height difference H is at least 25% of the minimum distance D between the coating and the second surface of the circuit board.

Figure 2:
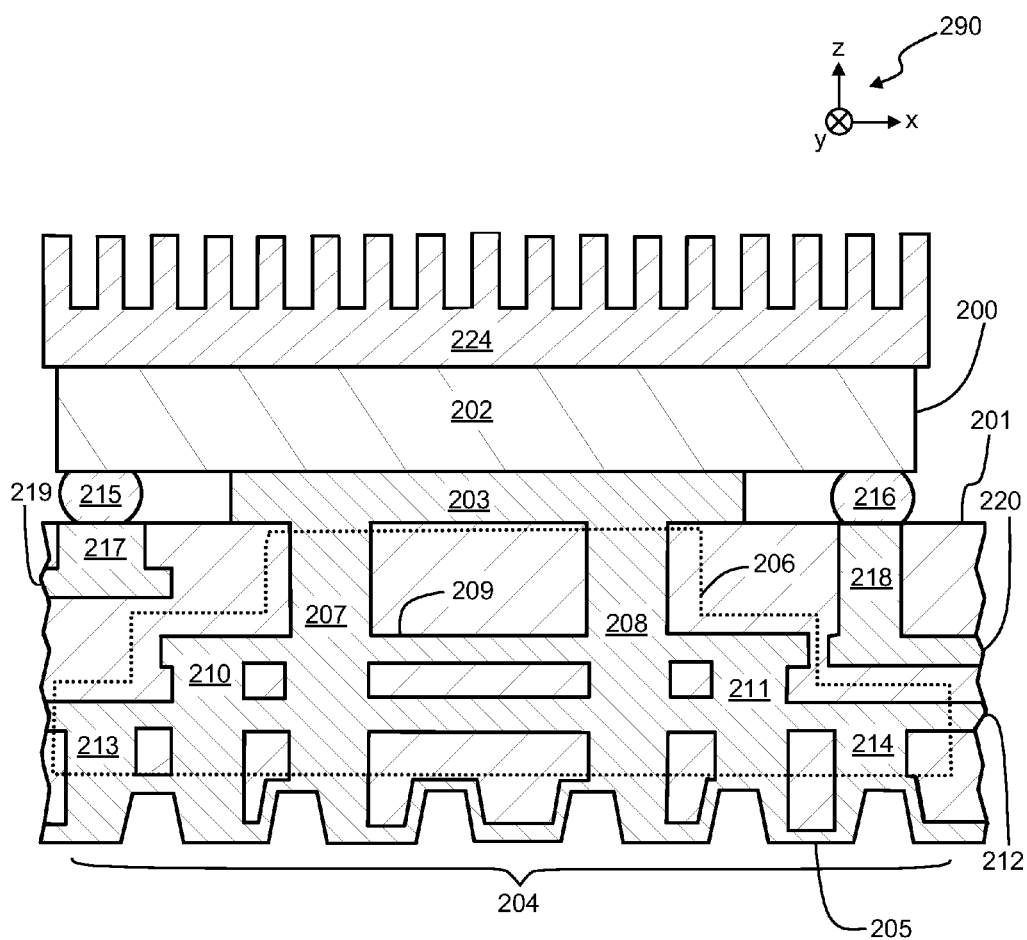
FIG. 2 shows a section view of a detail of a circuit board system according to another exemplifying embodiment of the invention.

FIG. 2 shows a section view of a detail of a circuit board system according to an exemplifying embodiment of the invention. The circuit board system comprises a circuit board 201 furnished with electrical components one of which is denoted with a reference number 202. The circuit board 201 is parallel with the xy-plane of a coordinate system 290. A first surface of the circuit board comprises a portion 204 that is uneven so as to increase the surface area of the portion. The portion is coated with a coating 205 made of conductor material so that the surface of the coating is uneven as illustrated in FIG. 2. The circuit board system comprises a conductor part 203 on a second surface of the circuit board 201 in heat conducting relation with the electrical component 202. In this exemplifying case, the conductor part 203 is between the electrical component 202 and the second surface of the circuit board 201. The circuit board comprises a heat conductive pathway 206 made of conductor material and extending from the conductor part 203 to the coating 205. Thus, the coating 205 operates as a cooling element for cooling the electrical component 202.

In the exemplifying circuit board system illustrated in FIG. 2, the heat conductive pathway 206 comprises first via-conductors connected to the conductor part 203 and to a first conductor 209 that is parallel with the circuit board and located inside the circuit board. In FIG. 2, two of the first via-conductors are denoted with reference numbers 207 and 208. The heat conductive pathway 206 comprises second via-conductors connected to the first conductor 209 and extending from the first conductor 209 towards the first surface of the circuit board. In FIG. 2, two of the second via-conductors are denoted with reference numbers 210 and 211. Each of the second via-conductors 210 and 211 is farther from the second surface of the circuit board than any of the first via-conductors 207 and 208 is. Furthermore, each of the second via-conductors is a distance apart from each of the first via-conductors in a direction parallel with the circuit board. The heat conductive pathway 206 comprises a second conductor 212 connected to the second via-conductors 210 and 211. The second conductor 212 is parallel with the circuit board and located inside the circuit board so that it is nearer to the first surface of the circuit board than the first conductor 209 is. In other words, the shortest distance from second conductor 212 to the first surface of the circuit board is smaller than the shortest distance from the first conductor 209 to the first surface of the circuit board. The circuit board 201 comprises third via-conductors extending from the second conductor 212 towards the first surface of the circuit board. In FIG. 2, two of the third via-conductors are denoted with reference numbers 213 and 214. Each of the third via-conductors 213 and 214 is farther from the second surface of the circuit board than any of the first and second via-conductors 207, 208, 210 and 211 is. In other words, the shortest distance from any of the third via-conductors to the second surface of the circuit board is greater than the shortest distance from any of the first and second via-conductors to the second surface of the circuit board. Furthermore, each of the third via-conductors is a distance apart from each of first and second via-conductors in a direction parallel with the circuit board. The conductor part 203, the coating 205, the first and second conductors 209 and 212, and the first, second, and third via-conductors 207, 208, 210, 211, 213, and 214 are advantageously made of metal or other material whose thermal conductivity is better than that of the electrically insulating material of the circuit board 201. The metal may comprise, for example but not necessarily, copper, tin, aluminum, and/or silver. The first and second conductors 209 and 212 can be, for example, planar conductors formed by conductor layers of the circuit board.

The heat conductive pathway 206 constituted by the first, second, and third via-conductors 207, 208, 210, 211, 213 and 214, and the first and second conductors 209 and 212 is arranged to circumvent the room needed for electrical conductors connected to the electrical component 202. In the exemplifying case illustrated in FIG. 2, the electrical conductors comprise via-conductors 217 and 218 connected to electrical terminals 215 and 216 of the electrical component 202 and conductors 219 and 220 that are parallel with the circuit board and located inside the circuit board. In the exemplifying case illustrated in FIG. 2, the electrical terminals 215 and 216 of the electrical component 202 are connection balls.

In the exemplifying circuit board system illustrated in FIG. 2, the first via-conductors 207 and 208 are connected also to the second conductor 212 and extend through the first and second conductors to the coating 205, the second via-conductors 210 and 211 extend through the second conductor 212 to the coating 205, and the third via-conductors 213 and 214 extend to the coating 205.

The exemplifying circuit board system illustrated in FIG. 2 further comprises a cooling element 224 on top of the electrical component 202 so as to make the cooling more effective.

Figure 3A:
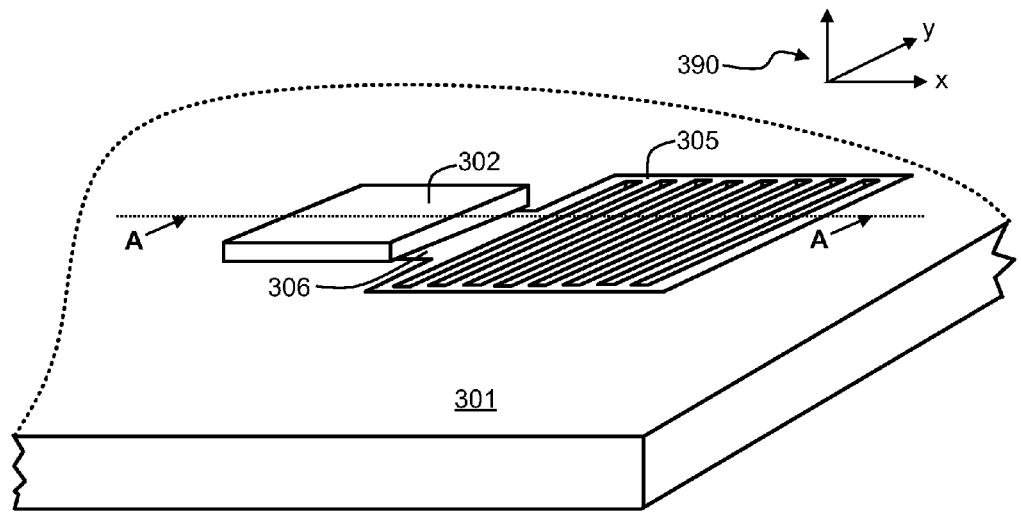
FIGS. 3a and 3b illustrate a detail of a circuit board system according to an exemplifying embodiment of the invention.
Figure 3B:
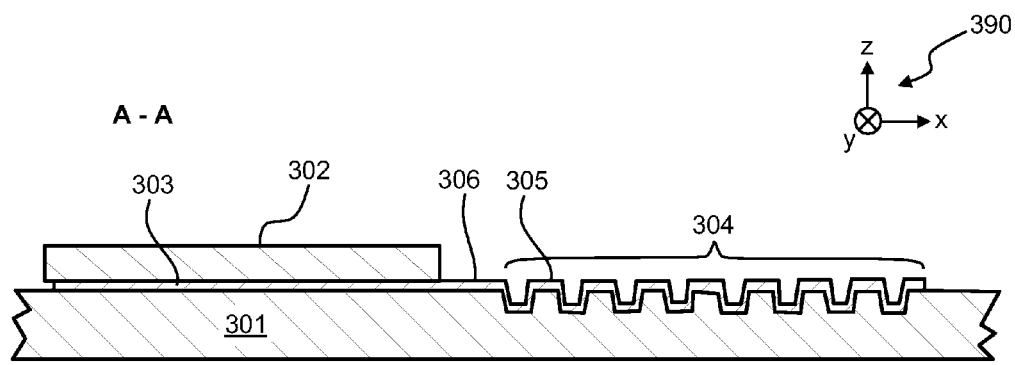

FIG. 3a shows a perspective view of a part of a circuit board system according to an exemplifying embodiment of the invention. FIG. 3b shows a view of a section taken along the line A-A shown in FIG. 3a. The circuit board system comprises a circuit board 301 furnished with electrical components one of which is denoted with a reference number 302. The circuit board 301 is parallel with the xyplane of a coordinate system 390. A first surface of the circuit board comprises a portion 304 that is uneven so as to increase the surface area of the portion. The portion is coated with a coating 305 made of conductor material so that the surface of the coating is uneven as illustrated in FIGS. 3a and 3b. The circuit board system comprises a conductor part 303 on the first surface of the circuit board 301 in heat conducting relation with the electrical component 302. In this exemplifying case, the conductor part 303 is between the electrical component 302 and the first surface of the circuit board 301. It is also possible that the conductor part 303 is embedded in the circuit board so that a surface of the conductor part 303 constitutes a part of the first surface of the circuit board. In some cases it is possible that the conductor part is beside the electrical component so that the electrical component is pressed against the conductor part in a direction parallel with the circuit board. The circuit board comprises a heat conductive pathway 306 made of conductor material and extending, along the first surface of the circuit board, from the conductor part 303 to the coating 305 as illustrated in FIGS. 3a and 3b. Thus, the coating 305 operates as a cooling element for cooling the electrical component 302.

The specific examples provided in the description given above should not be construed as limiting the applicability and/or the interpretation of the appended claims. For example, the above illustrated principle is applicable also in cases where the electrical component is inside the circuit board and there is a heat conductive pathway from the electrical component to a surface of the circuit board.

What is claimed is:

1. A circuit board system comprising:
   a circuit board having a first surface and a second surface opposite to the first surface,
   at least one electrical component, and
   a conductor part in heat conducting relation with the electrical component, wherein:
   the first surface of the circuit board comprises a portion that is uneven so as to increase surface area of the portion, the portion of the first surface of the circuit board comprising at least one of the following for increasing the surface area of the portion: grooves, cavities
   the portion of the first surface is coated with a coating made of conductor material so that a surface of the coating is uneven, and
   the circuit board comprises a heat conductive pathway made of conductor material and extending from the conductor part to the coating.

2. A circuit board system according to claim 1, wherein the electrical component is located on the second surface of the circuit board and the heat conductive pathway extends, through the circuit board, from the conductor part to the coating.

3. A circuit board system according to claim 1, wherein the electrical component is located on the first surface of the circuit board and the heat conductive pathway extends, along the first surface of the circuit board, from the conductor part to the coating.

4. A circuit board system according to claim 2, wherein the heat conductive pathway comprises:
one or more first via-conductors connected to the conductor part and extending from the conductor part towards the first surface of the circuit board,
a first conductor connected to the one or more first via-conductors and being parallel with the circuit board and located inside the circuit board, and
one or more second via-conductors connected to the first conductor and extending from the first conductor towards the first surface of the circuit board, each second via-conductor being farther from the second surface of the circuit board than any of the one or more first via-conductors is and each second via-conductor being a distance apart from each of the one or more first via-conductors in a direction parallel with the circuit board.

5. A circuit board system according to claim 4, wherein the one or more first via-conductors extend through the first conductor to the coating and the one or more second via-conductors extend to the coating.

6. A circuit board system according to claim 4, wherein the heat conductive pathway further comprises:
a second conductor connected to the one or more second via-conductors and being parallel with the circuit board and located inside the circuit board so that the second conductor is nearer to the first surface of the circuit board than the first conductor is, and
one or more third via-conductors extending from the second conductor towards the first surface of the circuit board, each third via-conductor being farther from the second surface of the circuit board than any of the first and second via-conductors is and each third via-conductor being a distance apart from each of the first and second via-conductors in a direction parallel with the circuit board.

7. A circuit board system according to claim 5, wherein the heat conductive pathway further comprises:
a second conductor connected to the one or more second via-conductors and being parallel with the circuit board and located inside the circuit board so that the second conductor is nearer to the first surface of the circuit board than the first conductor is, and
one or more third via-conductors extending from the second conductor towards the first surface of the circuit board, each third via-conductor being farther from the second surface of the circuit board than any of the first and second via-conductors is and each third via-conductor being a distance apart from each of the first and second via-conductors in a direction parallel with the circuit board.

8. A circuit board system according to claim 6, wherein the one or more first via-conductors are connected to the second conductor and extend through the first and second conductors to the coating, the one or more second via-conductors extend through the second conductor to the coating, and the one or more third via-conductors extend to the coating.

9. A circuit board system according to claim 7, wherein the one or more first via-conductors are connected to the second conductor and extend through the first and second conductors to the coating, the one or more second via-conductors extend through the second conductor to the coating, and the one or more third via-conductors extend to the coating.

10. A circuit board system according to claim 4, wherein the circuit board comprises one or more electrical conductors connected to electrical terminals of the electrical component, the electrical conductors being partially located in one or more spatial areas between the electrical terminals of the electrical component and a part of the heat conductive pathway.

11. A circuit board system according to claim 1, wherein the conductor part, the coating, and the heat conductive pathway are made of one or more conductive materials each having thermal conductivity better than that of electrically insulating material of the circuit board.

12. A circuit board system according to claim 11, wherein each of the one or more conductive materials is metal.

13. A circuit board system according to claim 12, wherein the metal comprises at least one of the following: copper, tin, aluminum, silver.

14. A circuit board system according to claim 1, wherein the surface of the coating is uneven so that a maximum height difference in a direction perpendicular to the circuit board is at least 15% of a minimum distance between the coating and the second surface of the circuit board.

15. A circuit board system according to claim 14, wherein the maximum height difference is at least 25% of the minimum distance between the coating and the second surface of the circuit board.

16. A circuit board system according to claim 1, wherein the circuit board system comprises a processing system for supporting at least one of the following data transfer protocols: Internet Protocol "IP", Ethernet protocol, MultiProtocol Label Switching "MPLS" protocol, Asynchronous Transfer Mode "ATM".

* * * * *